United States Patent
Naba

[11] Patent Number: 5,807,626
[45] Date of Patent: Sep. 15, 1998

[54] CERAMIC CIRCUIT BOARD

[75] Inventor: Takayuki Naba, Kawasaki, Japan

[73] Assignee: Kabushiki Kaisha Toshiba, Kawasaki, Japan

[21] Appl. No.: 716,279

[22] PCT Filed: Jul. 12, 1996

[86] PCT No.: PCT/JP96/01957

§ 371 Date: Sep. 30, 1996

§ 102(e) Date: Sep. 30, 1996

[87] PCT Pub. No.: WO97/04483

PCT Pub. Date: Feb. 6, 1997

[30] Foreign Application Priority Data

Jul. 21, 1995 [JP] Japan .................................. 7-185842

[51] Int. Cl.$^6$ .............................. H01L 23/14; H05K 3/38
[52] U.S. Cl. ...................... 428/210; 428/615; 428/660; 428/662; 428/671; 428/673; 228/122.1; 228/180.21; 174/259
[58] Field of Search .................................. 428/210, 615, 428/660, 662, 671, 673; 174/259; 228/122.1, 180.21

[56] References Cited

U.S. PATENT DOCUMENTS

| | | | |
|---|---|---|---|
| 4,634,041 | 1/1987 | Prasad et al. | 228/124 |
| 4,657,825 | 4/1987 | Kanda et al. | 428/627 |
| 4,693,409 | 9/1987 | Mizunoya et al. | 228/122.1 |
| 4,835,344 | 5/1989 | Iyogi et al. | 174/267 |
| 4,849,292 | 7/1989 | Mizunoya et al. | 428/433 |
| 4,919,731 | 4/1990 | Iyogi et al. | 148/24 |
| 5,328,751 | 7/1994 | Komorita et al. | 428/209 |
| 5,354,415 | 10/1994 | Fushii et al. | 216/13 |
| 5,561,321 | 10/1996 | Hirano et al. | 428/620 |

FOREIGN PATENT DOCUMENTS

| | | |
|---|---|---|
| 4-305072 | 3/1991 | Japan . |
| 5-97532 | 10/1991 | Japan . |
| 7-82050 | 9/1993 | Japan . |

*Primary Examiner*—Cathy F. Lam
*Attorney, Agent, or Firm*—Oblon, Spivak, McClelland, Maier & Neustadt, P.C.

[57] ABSTRACT

A ceramic circuit board is characterized by being constituted by bonding a ceramic substrate 2 and a metal circuit plate 3 to each other through a silver-copper-based brazing material layer 5 containing at least one active metal selected from Ti, Zr, Hf, V, Nb and Ta, and wherein the Vickers hardness of a reaction product layer 6 generated by causing the silver-copper-based brazing material layer 5 and the ceramic substrate 2 to react with each other is 1,100 or more. At least one element selected from In, Zn, Cd, and Sn is preferably contained in the silver-copper-based brazing material layer 5. Further, 0.1 to 10.0 wt % of carbon powder is preferably contained in the brazing material layer 5. According to the above arrangement, there can be provided a ceramic circuit board in which cracks are effectively suppressed from being formed even after a thermal cycle is repeatedly applied for a long period of time, i.e., a ceramic circuit board having so-called excellent heat-cycle resistance characteristics and high reliability.

14 Claims, 1 Drawing Sheet

CERAMIC CIRCUIT BOARD

TECHNICAL FIELD

The present invention relates to a ceramic circuit board formed in such a manner that a metal circuit plate is bonded to a ceramic substrate with a brazing material and, more particularly, to a ceramic circuit board in which the bonding strength of a metal circuit plate is high, heat-cycle resistance characteristics are excellent, and reliability is high.

BACKGROUND ART

A conventional ceramic circuit board in which a metal circuit plate having conductivity is integrally bonded to the surface of a ceramic substrate such as an alumina ($Al_2O_3$) sintered body having excellent insulating characteristics is popularly used as a constituent part of a semiconductor device.

As a conventional method of integrally bonding a ceramic substrate and a metal circuit board to each other, a refractory metal method (metalize method), a direct bonding method, or an active metal method is employed. The refractory metal method is a method of baking a refractory metal such as Mo or W on a ceramic substrate surface; the direct bonding method is a method of directly heat-bonding a metal circuit plate to a ceramic substrate surface using an eutectic liquid phase between a metal circuit plate component and oxygen as a bonding agent without using a brazing material or the like; and the active metal method is a method of integrally bonding a metal circuit plate and a non-oxide-based ceramic substrate to each other through a brazing material containing an active metal such as Ti. In particular, in order to obtain a ceramic circuit board having high strength, good sealing properties, and good reliability, the active metal method of the above methods is generally used.

The ceramic circuit board requires high bonding strength as the base of structure strength. On the other hand, in order to hold a structure which sufficiently withstands a thermal cycle which repetitively acts under the operation conditions of a semiconductor element serving as a mounted heat-generating part, formation of cracks caused by the linear expansion coefficient difference between the ceramic substrate and the metal circuit plate in a thermal cycle test (TCT) must be suppressed.

However, in a ceramic circuit board in which a metal circuit board is integrally bonded to a ceramic substrate by a brazing material containing an active metal such as Ti, a brittle reaction phase is easily generated on the bonding interface. For this reason, the following problems are posed. That is, sufficient bonding strength cannot be obtained, cracks are easily formed in the bonded portion of the ceramic substrate, and a circuit board having high reliability cannot be obtained.

Even if the ceramic substrate and the metal circuit plate are temporarily bonded to each other at high bonding strength, fine cracks are formed in the stage in which a thermal cycle to be applied is low. When the cracks grows with time, the bonding strength is degraded, and the ceramic substrate is broken or chipped at last. Therefore, reliability cannot be easily maintained for a long period of time.

The present invention has been made to solve the above problems, and has as its object to provide a ceramic circuit board in which cracks are effectively suppressed from being formed even after a thermal cycle is repeatedly applied for a long period of time, i.e., a ceramic circuit board having so-called excellent heat-cycle resistance characteristics and high reliability.

DISCLOSURE OF INVENTION

In order to achieve the above object, the present inventor prepared ceramic substrates with changing the type and amount of element contained in the brazing material for bonding the ceramic substrate and the metal circuit plate, and compared and examined influences of the types of elements contained in the brazing material on the bonding strength of the circuit board, heat-cycle resistance characteristics, and the strength characteristics of the bonded portion.

As a result, the following finding could be obtained. When a substrate and a circuit plate were bonded to each other using a brazing material compositely containing certain types of active metals or a brazing material compositely containing an active metal and an element such as In to prepare a ceramic circuit board, the hardness of a reaction product layer formed in the bonded portion increased. It was found that the heat-cycle resistance characteristics of the ceramic circuit board were improved with an increase in hardness.

The following finding could be also obtained. That is, when a predetermined amount of carbon (C) powder was contained in the brazing material layer, the thermal expansion difference between the ceramic substrate and the brazing material layer could be decreased, breaking of the circuit board caused by adding a thermal cycle could be effectively prevented. The present invention is completed on the basis of these acknowledgements.

More specifically, a ceramic circuit board according to the first invention of this application is characterized by being constituted by bonding a ceramic substrate and a metal circuit plate to each other through a silver-copper-based brazing material layer containing silver as a main component and containing at least one active metal selected from Ti, Zr, Hf, V, Nb and Ta, and wherein the Vickers hardness of a reaction product layer generated by causing the silver-copper-based brazing material layer and the ceramic substrate to react with each other is not less than 1,100.

A ceramic circuit board according to the second invention of this application is characterized by being constituted by bonding a ceramic substrate and a metal circuit plate to each other through a silver-copper-based brazing material layer containing silver as a main component and containing at least one active metal selected from Ti, Zr, Hf, V, Nb and Ta, and wherein the silver-copper-based brazing material layer contains not less than 5 wt % and less than 20 wt % of at least one element selected from In, Zn, Cd and Sn. The silver-copper-based brazing material layer is preferably constituted by an Ag-Cu-In-Ti-based brazing material layer.

A metal plate is preferably bonded, through the silver-copper-based material layer, to a ceramic substrate surface opposing the surface to which the metal circuit plate is bonded.

A ceramic circuit board according to the third invention of this application is characterized by being constituted by bonding a ceramic substrate and a metal circuit plate to each other through a silver-copper-based brazing material layer containing silver as a main component and containing carbon powder and at least one active metal selected from Ti, Zr, Hf, V, Nb and Ta.

A carbon powder content in the silver-copper-based brazing material layer is preferably set to be 0.1 to 10.0 wt %, more preferably, 0.1 to 5.0 wt %. An active metal content in the silver-copper-based brazing material layer preferably falls within the range of 0.5 to 10 wt %.

The silver-copper-based brazing material layer preferably contents at least one element selected from In, Zn, Cd, and Sn.

The content of at least one element selected from In, Zn, Cd, and Sn is set to be not less than 5 wt % and less than 20 wt %. The silver-copper-based brazing material layer is preferably constituted by an Ag-Cu-In-Ti-based brazing material layer.

A metal plate is preferably bonded, through the silver-copper-based material layer, to a ceramic substrate surface opposing the surface to which the metal circuit plate is bonded.

As a ceramic substrate constituting the circuit board, a nitride-based ceramic substrate consisting of aluminum nitride (AlN), silicon nitride ($Si_3N_4$), sialon (Si-Al-O-N), or the like which reacts with a brazing material content such as an active metal to form a reaction product layer having high hardness is preferably used. However, an oxide-based ceramic substrate or a carbide-based ceramic substrate can be also applied in the same manner as described above. For example, when an oxide-based ceramic substrate consisting of alumina ($Al_2O_3$) or the like is used, a reaction product layer consisting of $TiO_2$ is formed to strengthen the bonded portion. When a carbide-based ceramic substrate consisting of silicon carbide (SiC) or the like is used, a reaction product layer consisting of TiC is formed to strengthen the bonded portion in the same manner as described above.

As a metal circuit plate, any metal circuit plate consisting of a metal having electric conductivity can be used. However, in consideration of electric resistivity or costs, a circuit plate consisting of copper or aluminum is preferably used.

In the present invention, as a brazing material for forming the silver-copper-based brazing material layer, a silver-copper-based brazing material containing silver (Ag) as a main component is particularly preferably used. For example, a paste having a composition constituted by 15 to 35 wt % of Cu, 0.5 to 10 wt % of at least one active metal selected from Ti, Zr, Hf, V, Nb, and Ta, and Bal. substantially consisting of Ag is used. The paste is prepared by dispersing the composition in an organic solvent.

In the present invention, the brazing material layer containing silver as a main component is called and defined as a brazing material layer containing at least 50 wt % or more of Ag. In addition, 0.1 to 10.0 wt %, more preferably, 0.1 to 5.0 wt % of carbon (C) powder are contained in the brazing material layer.

In the brazing material composition, an Ag-Cu component is effective as a component for enhancing formation of a bonded layer between a ceramic sintered body substrate and an active metal such as Ti. The active metal such as Ti is diffused in the bonded layer (brazing material layer) to contribute to formation of a strong bonded body. Although the ratio of Ag to Cu in the Ag-Cu component may be set to be a ratio at which an eutectic composition (72 wt % of Ag-28 wt % of Cu) is easily generated to reduce a generation amount of liquid phase, the ratio may be set within other ranges.

The active metal such as Ti contained in the brazing material also has an effect for improving the wettability of the brazing material to the ceramic substrate. The content such an active metal is set to be 0.5 to 10 wt % with respect to the entire amount of brazing material layer. If the content of the active metal is lower than 0.5 wt %, the wettability cannot be improved. As the content increases, the wettability between the brazing material and the ceramic substrate is improved. If the content is excessive, i.e., higher than 10 wt %, a brittle reaction phase (reaction product phase) is easily generated on a bonding interface, and bonding strength and the structural strength of the overall bonded body are degraded.

At least one element selected from In, Zn, Cd, and Sn may be added to the brazing material at 5 wt % or more to less than 20 wt %. The elements In, Zn, Cd, and Sn form an intermetallic compound having relatively high hardness together with the active metal, the brazing material component, and the ceramic substrate component, and enhances the apparent strength of the ceramic substrate. Even if thermal stress generated by the ceramic substrate in TCT increases, In, Zn, Cd, and Sn prevent cracks from being easily formed, and considerably improve the heat-cycle resistance characteristics of the circuit board.

In addition, In, Zn, Cd, and Sn are effective to decrease a bonding temperature by the brazing material and to decrease a generation amount of thermal stress to decrease residual stress after bonding. If the content of these elements is lower than 5 wt %, an effect for increasing the hardness and an effect of decreasing the bonding temperature are poor. On the other hand, if the content is 20 wt % or more, a change in brazing material composition increases, a bonding strength which is sufficient to improve the reliability of the circuit board cannot be obtained.

In the brazing material composition, the carbon (C) powder is a component for reducing the residual stress of the bonded portion and contributes to improvement on the heat-cycle resistance characteristics of the circuit board. More specifically, the linear expansion coefficient of the carbon powder is about $4 \times 10^{-6}$/K. When this carbon powder is contained in the brazing material composition, the linear expansion coefficient of the brazing material layer itself is close to the linear expansion coefficient of the ceramic substrate. For this reason, the residual stress of the circuit board after the bonding operation can be reduced, and the heat-cycle resistance characteristics can be improved.

When the content of the carbon powder is lower than 0.1 wt %, an effect for improving the heat-cycle resistance characteristics caused by moderation of the residual stress is not sufficient. On the other hand, the content of the carbon powder exceeds 10 wt %, the brazing material composition cannot be easily pasted. For example, the brazing material layer cannot be formed by a screen printing method. Even if the brazing material layer can be formed by the screen printing method, the bonding strength of the metal circuit plate is degraded. Therefore, the content of the carbon powder is set within the range of 0.1 to 10 wt %. The content is preferably set within the range of 0.1 to 5.0 wt %, more preferably, 0.5 to 1.5 wt %.

As the carbon powder, carbon powder having an average grain size of 10 $\mu$m or less is preferably used. If coarse carbon powder having an average grain size of larger than 10 $\mu$m, the brazing material component paste cannot be easily uniformly prepared, and the paste cannot be easily screen-printed. The average grain size of the carbon powder is preferably set to be 5 $\mu$m or less.

The thickness of the silver-copper-based brazing material layer considerably influences the bonding strength of the bonded body, and is set within the range of 15 to 35 $\mu$m in the present invention. If the thickness of the brazing material layer is smaller than 15 $\mu$m, sufficient bonding strength cannot be obtained, and the degree of contactness between the ceramic substrate and the metal circuit plate is degraded. The heat resistance of the overall circuit board increases, and the heat-radiation characteristics are degraded. On the other hand, if the thickness of the brazing material layer exceeds 35 μm, a brittle reaction phase is easily generated on a bonding interface, stress generated on the ceramic substrate increases. In any cases, sufficient bonding strength cannot be obtained.

When a metal plate which is slightly thinner than the metal circuit plate is bonded, through the silver-copper-based brazing material layer, to a nitride-based ceramic substrate surface opposing a surface to which the metal circuit plate is bonded, warpage of the ceramic circuit board caused by a bonding operation can be effectively prevented. More specifically, when amounts of metal arranged on the front and rear surfaces of the ceramic substrate are made equal to each other, the thermal expansion coefficients on both the surfaces of the ceramic substrate can be made equal to each other. For this reason, the warpage of the circuit board caused by the thermal expansion difference between both the surfaces of the ceramic substrate can be prevented.

The ceramic circuit board according to the present invention is manufactured in, e.g., the following procedures. A paste-like Ag-Cu-based brazing material composition containing 0.1 to 10 wt % of carbon powder and 0.5 to 10 wt % of an active metal such as Ti is coated on the bonding surface between a ceramic substrate consisting of AlN, $Si_3N_4$, SiAlON, or the like and a metal circuit plate or the like consisting of Cu. In this state, the metal circuit plate is pressed against the ceramic substrate. The resultant structure is held at a temperature of 800° to 900° C. for 10 to 15 minutes in a heating furnace set in a vacuum state of $10^{-4}$ Torr or less, in a heating furnace in which an inert gas atmosphere such as an argon (Ar) gas atmosphere is set, or in a heating furnace in which a nitrogen ($N_2$) gas atmosphere is set, thereby integrally bonding the ceramic substrate to the metal circuit board to each other.

In the bonding operation using the active metal method, to strengthen the metalize interface between the ceramic substrate and the Ag-Cu-based brazing material, and to enhance formation of a reaction product layer formed by reaction between the active metal element and the ceramic component, a weight ratio of Ag:Cu is preferably set to be an eutectic composition rate of 72:28. Since the melting point of the brazing material having the eutectic composition ratio is about 780° C., the actual bonding temperature is set at 800° to 900° C.

In the manufacturing method, since the brazing material cannot be sufficiently melted when the bonding temperature is lower than 800° C., the degree of contactness between the ceramic substrate and the metal circuit plate is degraded. On the other hand, when the bonding temperature exceeds 900° C., a brittle reaction phase is easily generated on the bonding surface. In any cases, the bonding strength is degraded.

In this case, when the Ag-Cu-based brazing material contains 5 to 20 wt % of at least one component selected from In, Zn, Cd, and Sn, the melting point of the brazing material decreases to about 680° C. As a result, the bonding operation can be performed within a low-temperature range of 700° to 800° C. The decrease in bonding temperature causes a decrease in residual stress of the circuit board after the bonding operation. As a result, the heat-cycle resistance characteristics of the circuit board can be further improved.

When the heat-bonding operation causes the component such as an active metal constituting the brazing material to react with the ceramic substrate component, a reaction product layer having a thickness of about 2 to 3 μm and a high Vickers hardness of 1,100 or more is formed.

For example, when an AlN substrate and a Cu circuit plate are bonded to each other using an In-Ag-Cu-Ti-based brazing material to manufacture a circuit board, a reaction product layer consisting of an intermetallic compound such as (Ti, Cu, In, Al)-N containing TiN or components is formed on the interface between the brazing material layer and the AlN substrate.

When the brazing material contains 2 to 7 wt % of Nb or Ta, these elements are diffused on the reaction product layer side to increase the hardness of the reaction product layer. In particular, since the hardness of the intermetallic compound containing In higher than that of other compounds, the Vickers hardness of the reaction product layer increases about 1,100 to 1,200.

The hardness of the reaction product layer considerably influences the heat-cycle resistance characteristics of the ceramic circuit board, and the Vickers hardness (Hv) of the reaction product layer can be increased to 1,100 or more in the present invention. When the hardness is smaller than 1,100, the strength of the ceramic substrate in the bonded portion is insufficient, and cracks are easily formed by stress generated when a heat cycle is applied. For this reason, the heat-cycle resistance characteristics of the circuit board cannot be easily improved.

In the ceramic circuit board according to the present invention, since the Vickers hardness of the reaction product layer generated by causing a brazing material component to react with a ceramic substrate component can be set to be 1,100 or more, the strength of the ceramic substrate in the bonded portion can be substantially increased. Cracks are rarely formed even in a case wherein large thermal stress is generated when a heat cycle is applied. Therefore, a ceramic circuit board having excellent heat-cycle resistance characteristics and high reliability can be provided.

When In, Sn, or the like is added to the brazing material composition, the wettability of the brazing material composition to the substrate and the fluidity of the brazing material itself are considerably improved. For this reason, when the metal circuit board material is pressed and bonded to the substrate after the brazing material composition is pattern-printed on the substrate, the brazing material is easily extended from the outer edge of the metal circuit plate material.

Although the extended brazing material is removed by an etching process after a dedicated etchant is used, a circuit board having a predetermined shape must be formed, and after etching must be performed a predetermined of times. For this reason, the steps in manufacturing a circuit board are disadvantageously cumbersome. In particular, since the etchant used in the after etching is strong alkaline, when an aluminum nitride (AlN) substrate is used as a ceramic substrate, the AlN substrate is corroded by the etchant, and the heat-cycle resistance characteristics of the circuit board may be degraded.

However, when a predetermined amount of carbon powder is contained in the brazing material composition as in the third embodiment of this application, the fluidity of the brazing material composition can be properly adjusted, extension of the brazing material can be effectively prevented. Therefore, the after etching process for removing the extended brazing material is not required, and the steps in manufacturing a circuit board can be considerably simplified.

In addition, when the carbon powder is contained in the brazing material, the extension of the brazing material can be prevented, and the metal circuit plate can be bonded to the ceramic substrate surface with a small amount of brazing material. More specifically, since a brazing material layer having high hardness can be formed to have a small thickness, the heat-cycle resistance characteristics of the circuit board can be further improved.

In the ceramic circuit board according to the third invention of this application, the silver-copper-based brazing material layer contains carbon powder and an active metal, and the carbon powder makes the linear expansion coefficient of the brazing material layer close to the linear expansion coefficient of the ceramic substrate. For this reason, residual stress after the metal circuit board is bonded is reduced.

The addition of the active metal component forms a strong metalize interface on the bonding surface, and the strength of the ceramic substrate in the bonded portion can be substantially improved. Even if larger thermal stress is generated when a heat cycle is applied, cracks are rarely formed.

When In or the like is contained in the brazing material phase, the melting point of the brazing material decreases, the bonding temperature of the metal circuit plate can be decreased, and residual stress of the circuit board after the bonding operation can be reduced. Therefore, a ceramic circuit board having excellent heat-cycle resistance characteristics and high reliability can be provided.

BEST MODE FOR CARRYING OUT THE INVENTION

Figure 1:
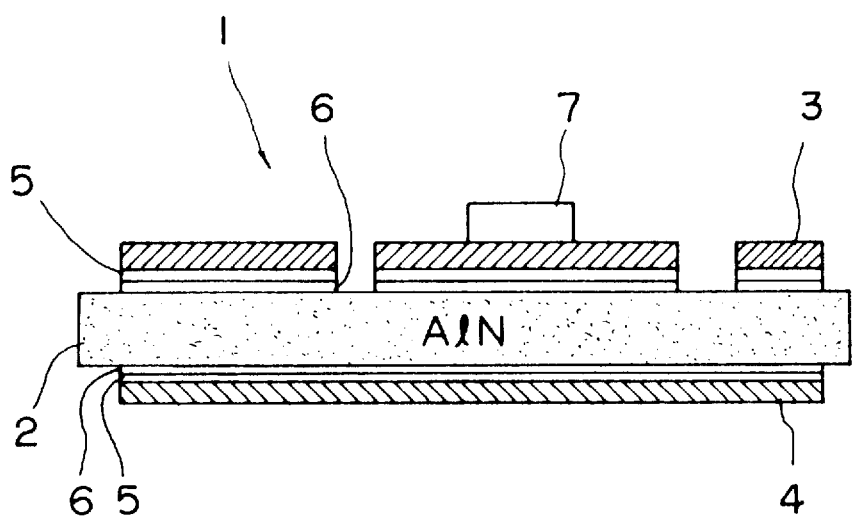
FIG. 1 is a sectional view showing an embodiment of a ceramic circuit board according to the present invention.

An embodiment of the present invention will be described below with reference to the following examples and the accompanying drawings.

EXAMPLES 1 TO 9

An aluminum nitride (AlN) sintered body having a thermal conductivity of 170 W/m.K and manufactured by an atmospheric-pressure sintering method was processed to prepare a large number of AlN substrates each having 29 mm (length)×63 mm (width)×0.635 mm (thickness), a large number of Cu circuit plates (metal circuit plates) consisting of copper dephosphate having a thickness of 0.3 mm, and a large number of Cu plates (metal plates).

Paste-like Ag-Cu-based brazing materials, having compositions shown in Table 1, for respective examples were prepared and printed on both the surfaces of the AlN substrates to form Ag-Cu-based brazing material layers. The Cu circuit plates and the Cu plates were brought into press contact with the surfaces of the AlN substrate surfaces through the brazing material layers. In this state, the press-contact bodies were stored in a heating furnace, heated to bonding temperatures shown in Table 1 at a high degree of vacuum of $1 \times 10^{-4}$ Torr or less, and held for 10 minutes to integrally bond the members to each other, thereby manufacturing a large number of ceramic circuit boards 1 according to Examples 1 to 9 shown in FIG. 1.

As shown in FIG. 1, the ceramic circuit board according to each example is formed such that an AlN substrate 2, a Cu circuit plate 3, and a Cu plate (rear copper plate) 4 are integrally bonded to each other through Ag-Cu-based brazing material layers 5 and reaction product layers 6 which are interposed between the AlN substrate 2 and the Cu circuit plate 3 and between the AlN substrate 2 and the Cu plate 4.

The reaction product layer 6 is formed by causing components contained in the brazing material to react with the contents of the AlN substrate 2. A semiconductor element (Si chip) 7 is bonded at a predetermined position of the Cu circuit plate 3 of the ceramic circuit board 1 by solder bonding, thereby forming a ceramic circuit board for constituting a semiconductor device.

COMPARATIVE EXAMPLE 1

A large number of ceramic circuit boards according to Comparative Example 1 were prepared such that respective members were integrally bonded to each other under the same conditions as in Example 3 except that a comparative Ag-Cu-Ti-based brazing material paste having a composition shown in Table 1 was used.

Evaluation

The following thermal shock test (thermal cycle test: TCT) was performed to evaluate the durability and reliability of the ceramic circuit boards according to Examples and Comparative Example prepared as described above, thereby examining crack formation states of the circuit boards.

The thermal cycle test was performed under the condition that the following heating-cooling cycle were repeatedly applied 500 times. That is, the circuit boards were held at −40° C. for 30 minutes, heated to room temperature (RT), and held for 10 minutes. Thereafter, the circuit boards were heated to +125° C., held for 30 minutes, cooled to room temperature, and then held at room temperature for 10 minutes.

After every 100 cycles were performed, five test samples were picked out. The five test samples were subjected to an etching process by an $FeCl_3$ solution to remove the Cu circuit plates and the Ag-Cu component of the brazing material, and the Vickers hardnesses Hv of reaction product layers generated on the AlN substrates were measured. After every 100 cycles were performed in the TCT, the reaction product layers were removed by using an etchant consisting of EDTA (ethylenediaminetetraacetic acid), $H_2O_2$, and $NH_4OH$, and PT (fluorescent penetrant test or inspection) was performed to the AlN substrate surfaces to examine the presence/absence of formation of fine cracks. The number of TCT cycles performed when cracks were formed in at least one of the five samples was examined. The measurement results are shown in Table 1 described below.

TABLE 1

| | Brazing Material Layer Composition (wt %) | | | | | | | | | | | | Bonding Temperature (°C.) | Vickers Hardness of Reaction Product Layer Hv (–) | Number of Formation Cycles of Cracks in Thermal Cycle Test (TCT) (Cycles) |
|---|---|---|---|---|---|---|---|---|---|---|---|---|---|---|---|
| | First Component (Active Metal) | | | | | | Second Component | | | | | | | | |
| Sample No. | Ti | Zr | Hf | V | Nb | Ta | In | Zn | Cd | Sn | Cu | Ag | | | |
| Example 1 | 4.0 | — | — | — | — | — | 14.0 | — | — | — | 23.0 | Bal. | 750 | 1150 | 300 |
| Example 2 | 4.0 | — | — | — | 5.0 | — | 14.0 | — | — | — | 22.0 | Bal. | 750 | 1200 | 400 |
| Example 3 | 4.0 | — | — | — | 5.0 | — | — | — | — | — | 25.5 | Bal. | 850 | 1180 | 400 |
| Example 4 | — | 4.0 | — | — | — | — | 14.0 | — | — | — | 23.0 | Bal. | 750 | 1120 | 300 |
| Example 5 | — | — | 4.0 | — | — | — | 14.0 | — | — | — | 23.0 | Bal. | 750 | 1300 | 600 |
| Example 6 | — | — | — | 4.0 | — | — | 14.0 | — | — | — | 23.0 | Bal. | 750 | 1200 | 500 |
| Example 7 | 4.0 | — | — | — | — | 5.0 | — | 26 | — | — | 18.2 | Bal. | 730 | 1200 | 500 |
| Example 8 | 4.0 | — | — | — | — | — | — | 18 | 20 | — | 16.2 | Bal. | 620 | 1150 | 300 |
| Example 9 | 4.0 | — | — | — | — | — | — | — | — | 1.0 | 26.6 | Bal. | 830 | 1120 | 300 |
| Comparative Example 1 | 4.0 | — | — | — | — | — | — | — | — | — | 26.9 | Bal. | 850 | 1030 | 100 |

As is apparent from the results shown in Table 1, in the ceramic circuit boards according to Examples, the Vickers hardnesses Hv of the reaction product layers were high, i.e., 1,100 or more, and the strength of the AlN substrates were substantially improved by the reaction product layers having high hardness. As a result, it was confirmed that no cracks were formed until 300 cycles were performed in the TCT and that excellent heat-cycle resistance characteristics could be obtained.

In this case, the Vickers hardnesses of the AlN substrates (thermal conductivity: 170 W/m.K) themselves used in Examples are about 1,200 to 1,500, and the Vickers hardnesses of the reaction product layers of the circuit boards in Examples are almost equal to the hardnesses of the AlN substrates themselves. Although the Vickers hardness Hv of TiN generated by heat bonding must be 2,000 or more, the actual Vickers hardness of the reaction product layer may decrease because the reaction product layer contains Cu or Al.

In the ceramic circuit board according to Comparative Example 1, a reaction product layer consisting of TiN and having high hardness must be formed. However, the following finding was obtained. That is, since diffusion of an active metal Ti was not actually insufficient, the high hardness of the reaction product layer was not sufficient, and sufficient heat-cycle resistance characteristics could not be obtained.

Next, an embodiment of a circuit board in which carbon powder is contained in a brazing material layer will be described below with reference to Examples described below.

EXAMPLES 10 TO 19

An aluminum nitride (AlN) sintered body having a thermal conductivity of 170 W/m.K and manufactured by an atmospheric-pressure sintering method were processed to prepare a large number of AlN substrates each having 29 mm (length)×63 mm (width)×0.635 mm (thickness), a large number of Cu circuit plates (metal circuit plates) consisting of copper dephosphate having a thickness of 0.3 mm, and a large number of Cu plates (metal plates).

An active metal powder serving as a first component, a second component powder such as In powder, and carbon (C) powder, Cu powder, and Ag powder each having an average grain size of 5 μm and serving as a third component were prepared, and paste-like Ag-Cu brazing materials, having the components shown in Table 2, for Examples were prepared. The brazing materials were printed on both the surfaces of the AlN substrates to form Ag-Cu-based brazing material layers. The Cu circuit plates and the Cu plates were brought into press contact with the respective AlN substrate surfaces through the brazing material layers.

In this state, the press-contact bodies were stored in a heating furnace, heated to bonding temperatures shown in Table 2 at a high degree of vacuum of $1\times10^{-4}$ Torr or less, and held for 10 minutes to integrally bond the members to each other, thereby manufacturing a large number of ceramic circuit boards 1 according to Examples 10 to 19 shown in FIG. 1.

COMPARATIVE EXAMPLES 2 TO 5

A large number of ceramic circuit boards according to Comparative Examples 2 to 5 were prepared such that respective members were integrally bonded to each other under the same conditions as in Example 10 except that a comparative Ag-Cu-Ti-based brazing material paste having a composition shown in Table 2 was used, that a Cu circuit plate and a Cu plate were bonded to each other at bonding temperatures shown in Table 2, or that an Ag-Cu-Ti-In-based brazing material paste in which a carbon powder content was set to be excessively small or large.

Evaluation

The bonding strengths (peel strengths) of the metal circuit plates were measured, and the following thermal shock test (thermal cycle test: TCT) was performed to evaluate the durability and reliability of the ceramic circuit boards according to Examples and Comparative Examples prepared as described above, thereby examining crack formation states of the circuit boards.

The thermal cycle test was performed under the condition that the following heating-cooling cycle were repeatedly applied 300 times. That is, the circuit boards were held at –40° C. for 30 minutes, heated to room temperature (RT), and held for 10 minutes. Thereafter, the circuit boards were heated to +125° C., held for 30 minutes, cooled to room temperature, and then held at room temperature for 10 minutes.

After every 30, 100, and 300 cycles were performed, five test samples were picked out. The five test samples were subjected to an etching process by an $FeCl_3$ solution to remove the Cu circuit plates and the Ag-Cu component of the brazing material to expose the reaction product layers formed on the AlN substrates. The reaction product layers were removed by an etchant, and PT (fluorescent penetrant inspection) was performed to the AlN substrate surfaces to examine the presence/absence of formation of fine cracks. Soundness rates η of the circuit boards after every 30, 100, and 300 cycles were performed were calculated according to equation (1) described below to evaluate the heat-cycle resistance characteristics of the circuit boards.

$$\text{soundness rate } \eta = (1 - \Sigma d/D) \times 100 \ (\%) \tag{1}$$

In this case, D is the entire length of a copper plate edge path in which cracks can be formed, and Σd is the sum of lengths (d1, d2, . . . , dn) of cracks formed on the path. Therefore, a soundness rate η of 100% means that any cracks are not formed, and a soundness rate of 0% means that cracks are formed in the entire surface of the substrate.

The measurement results are shown in Table 2 described below.

circuit plate was considerably degraded, and the strength of the overall circuit board was insufficient.

Industrial Applicability

As has been described above, in a ceramic circuit board according to the present invention, since the Vickers hardness of a reaction product layer generated by causing brazing material components to react with ceramic substrate components was set to be 1,100 or more, the strength of the ceramic substrate in the bonded portion can be substantially improved. Cracks are rarely formed even in a case wherein large thermal stress is generated when a heat cycle is applied.

When carbon powder and an active metal are contained in a silver-copper-based brazing material layer, the carbon powder makes the linear expansion coefficient of the brazing material layer close to the linear expansion coefficient of the ceramic substrate. For this reason, residual stress generated

TABLE 2

| Sample No. | Brazing Material Layer Composition (wt %) | | | | | | | | | | | Bonding Temperature (°C.) | Bonding Strength of Metal Circuit Plate (kgf/cm) | Soundness Rate of Circuit Board After TCZ η (%) | | |
|---|---|---|---|---|---|---|---|---|---|---|---|---|---|---|---|---|
| | First Component (Active Metal) | | | | Second Component | | | | Third Component | | | | | | | |
| | Ti | Zr | Hf | Nb | In | Zn | Cd | Sn | C | Cu | Ag | | | 30 Cycle | 100 Cycle | 300 Cycle |
| Example 10 | 4.0 | — | — | — | 14.0 | — | — | — | 1.0 | 23.0 | Bal. | 800 | 10.5 | 100 | 100 | 98.3 |
| Example 11 | — | — | — | 5.0 | 14.0 | — | — | — | 1.0 | 23.0 | Bal. | 800 | g.6 | 100 | 100 | 96.4 |
| Example 12 | 4.0 | — | — | — | 10.0 | — | — | — | 1.0 | 24.0 | Bal. | 820 | 11.3 | 100 | 100 | 100 |
| Example 13 | — | 4.0 | — | — | 14.0 | — | — | — | 1.0 | 23.0 | Bal. | 800 | 8.3 | 100 | 100 | 98.8 |
| Example 14 | — | — | 4.0 | — | 14.0 | — | — | — | 0.5 | 23.0 | Bal. | 800 | 8.4 | 100 | 100 | 96.0 |
| Example 15 | 4.0 | — | — | — | 14.0 | — | — | — | 2.0 | 22.0 | Bal. | 800 | 9.5 | 100 | 100 | 97.1 |
| Example 16 | 4.0 | — | — | — | 14.0 | — | — | — | 8.0 | 22.0 | Bal. | 820 | 7.8 | 100 | 100 | 92.2 |
| Example 17 | 4.0 | — | — | — | — | 20 | — | — | 1.0 | 22.0 | Bal. | 800 | 10.1 | 100 | 100 | 96.1 |
| Example 18 | 4.0 | — | — | — | — | — | — | 10.0 | 1.0 | 24.0 | Bal. | 780 | 12.3 | 100 | 100 | 100 |
| Example 19 | 4.0 | — | — | — | — | 18 | 18 | — | 1.0 | 17.0 | Bal. | 750 | 9.6 | 100 | 100 | 98.5 |
| Comparative Example 2 | 4.0 | — | — | — | 14.0 | — | — | — | — | 23.0 | Bal. | 800 | 12.2 | 100 | 98.3 | 97.2 |
| Comparative Example 3 | 4.0 | — | — | — | 14.0 | — | — | — | 0.05 | 23.0 | Bal. | 800 | 10.1 | 100 | 92.5 | 90.6 |
| Comparative Example 4 | 4.0 | — | — | — | 25.0 | — | — | — | 1.0 | 20.0 | Bal. | 800 | 8.6 | 96.5 | 82.3 | 70.7 |
| Comparative Example 5 | 4.0 | — | — | — | 14.0 | — | — | — | 11.0 | 21.0 | Bal. | 850 | 4.3 | 80.3 | 62.9 | 55.5 |

As is apparent from the results shown in Table 2, in the ceramic circuit boards according to Examples, although the bonding strengths of the metal circuit plates were almost equal to those of the conventional metal circuit plates in Comparative Examples, and the addition of carbon powder made the linear expansion coefficient of the brazing material layer close to the linear expansion coefficient of the substrate, and residual stress after bonding was reduced. As a result, it was confirmed that no cracks were formed until at least 100 cycles were performed in the TCT and that excellent heat-cycle resistance characteristics could be obtained.

In the ceramic circuit board according to Comparative Example 2 in which no carbon powder is contained in the brazing material layer, the following findings were obtained. That is, the bonding strength of the metal circuit plate was slightly higher than that in Example 10, however, the heat-cycle resistance characteristics were poor.

In Comparative Example 3 in which a carbon powder content was excessively small, an effect of improvement on heat-cycle resistance characteristics is small. On the other hand, in Comparative Example 5 in which a carbon powder content was excessively large, the following findings were obtained. That is, although heat-cycle resistance characteristics were preferable, the bonding strength of the metal after the metal circuit plate is bonded is reduced. The addition of the active metal component forms a strong metalize interface on the bonding surface, and the strength of the ceramic substrate in the bonded portion can be substantially improved. Even if larger thermal stress is generated when a heat cycle is applied, cracks are rarely formed.

When In or the like is contained in the brazing material phase, the melting point of the brazing material decreases, the bonding temperature of the metal circuit plate can be decreased, and residual stress of the circuit board after the bonding operation can be reduced. Therefore, a ceramic circuit board having excellent heat-cycle resistance characteristics and high reliability can be provided.

I claim:

1. A ceramic circuit board, which comprises a ceramic substrate and a metal circuit plate bonded to each other through a silver-copper-based brazing material layer containing silver as a main component, carbon in an amount of 0.1 to 10 wt %, and at least one active metal selected from the group consisting of Ti, Zr, Hf, V, Nb, and Ta, and wherein the Vickers hardness of a reaction product layer generated by causing the silver-copper-based brazing material layer and the ceramic substrate to react with each other is not less than 1100.

2. A ceramic circuit board, which comprises a ceramic substrate and a metal circuit plate bonded to each other through a silver-copper-based brazing material layer containing silver as a main component, carbon in an amount of 0.1 to 10 wt %, and at least one active metal selected from the group consisting of Ti, Zr, Hf, V, Nb and Ta, and wherein the silver-copper-based brazing material layer contains not less than 5 wt % and less than 20 wt % of at least one element selected from the group consisting of In, Zn, Cd and Sn.

3. The ceramic circuit board of claim 1 or claim 2, wherein the silver-copper-based brazing material layer is a Ag-Cu-In-Ti-based brazing material layer.

4. The ceramic circuit board of claim 1 or claim 2 which further comprises a metal plate bonded through a silver-copper-based material layer, to a ceramic substrate surface reverse to the surface to which the metal circuit plate is bonded.

5. The ceramic circuit board of claim 1 or claim 2, wherein said carbon is in a form of carbon powder.

6. The ceramic circuit board of claim 5, wherein the carbon powder content in the silver-copper-based brazing material layer is about 0.1 to 5.0 wt %.

7. The ceramic circuit board of claim 5, wherein the active metal content in the silver-copper-based brazing material layer is about 0.5 to 10 wt %.

8. The ceramic circuit board of claim 5, wherein the silver-copper-based brazing material layer further contains at least one element selected from the group consisting of In, Zn, Cd, and Sn.

9. The ceramic circuit board of claim 8, wherein the silver-copper-based brazing material layer contains not less than 5 wt % and less than 20 wt % of at least one element selected from In, Zn, Cd and Sn.

10. The ceramic circuit board of claim 5, wherein the silver-copper-based brazing material layer is an Ag-Cu-In-Ti-based brazing material layer.

11. The ceramic circuit board of claim 5, which further comprises a metal plate bonded, through the silver-copper-based material layer, to a ceramic substrate surface reverse to the surface to which the metal circuit plate is bonded.

12. The ceramic circuit board of claim 1 or claim 2, wherein said ceramic substrate is nitride-based, oxide-based or carbide-based.

13. The ceramic circuit board of claim 5, wherein said carbon powder has an average grain size of 10 $\mu$m or less.

14. The ceramic circuit board of claim 13, wherein said carbon powder has an average grain size of 5 $\mu$m or less.

* * * * *